(12) United States Patent
Formosa et al.

(10) Patent No.: US 12,017,910 B2
(45) Date of Patent: Jun. 25, 2024

(54) METHOD OF MANUFACTURING ELECTRONIC DEVICES AND CORRESPONDING ELECTRONIC DEVICE

(71) Applicants: STMicroelectronics (MALTA) Ltd, Kirkop (MT); STMicroelectronics S.r.l., Agrate Brianza (IT)

(72) Inventors: Kevin Formosa, Zabbar (MT); Marco Del Sarto, Monza (IT)

(73) Assignees: STMicroelectronics (MALTA) Ltd, Kirkop (MT); STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 18/079,704

(22) Filed: Dec. 12, 2022

(65) Prior Publication Data

US 2023/0110259 A1 Apr. 13, 2023

Related U.S. Application Data

(62) Division of application No. 16/834,042, filed on Mar. 30, 2020, now Pat. No. 11,524,892.

(30) Foreign Application Priority Data

Apr. 19, 2019 (IT) .......................... 102019000004835

(51) Int. Cl.
*B81B 7/00* (2006.01)
*B81C 1/00* (2006.01)

(52) U.S. Cl.
CPC ........ *B81C 1/00333* (2013.01); *B81B 7/0077* (2013.01); *B81B 2201/0264* (2013.01);
(Continued)

(58) Field of Classification Search
CPC ... B81B 7/0032; B81B 7/0064; B81B 7/0074; H01L 25/042; H01L 25/0655; H01L 25/072; H01L 25/0753
See application file for complete search history.

(56) References Cited

U.S. PATENT DOCUMENTS 9,346,667 B2 5/2016 Ghahremani et al.
9,613,930 B2 4/2017 Palm
(Continued)

FOREIGN PATENT DOCUMENTS

DE 102014115509 A1 4/2015
DE 102015108335 A1 12/2015

OTHER PUBLICATIONS

IT Search Report and Written Opinion for IT Appl. No. 102019000004835 dated Dec. 9, 2019 (8 pages).
(Continued)

*Primary Examiner* — Moazzam Hossain
(74) *Attorney, Agent, or Firm* — Crowe & Dunlevy LLC

(57) ABSTRACT

A first electronic component, such as a sensor having opposed first and second surfaces and a first thickness, is arranged on a support member with the second surface facing towards the support member. A second electronic component, such as an integrated circuit mounted on a substrate and having a second thickness less than the first thickness, is arranged on the support member with a substrate surface opposed the second electronic component facing towards the support member. A package molding material is molded onto the support member to encapsulate the second electronic component while leaving exposed the first surface of the first electronic component. The support member is then removed to expose the second surface of the first electronic component and the substrate surface of the substrate.

19 Claims, 3 Drawing Sheets

(52) U.S. Cl.
CPC ..... *B81B 2207/012* (2013.01); *B81B 2207/07* (2013.01); *B81C 2203/0154* (2013.01); *B81C 2203/0792* (2013.01)

(56) References Cited

U.S. PATENT DOCUMENTS

| | | |
|---|---|---|
| 2009/0057885 A1 | 3/2009 | Theuss |
| 2013/0075892 A1* | 3/2013 | Lin .................. H01L 23/48 |
| | | 257/737 |
| 2017/0015548 A1 | 1/2017 | Mao et al. |
| 2022/0002145 A1* | 1/2022 | Chang .................. B81B 7/007 |

OTHER PUBLICATIONS

First Office Action for family-related EP Appl. No. 20164126.3, report dated Jul. 12, 2022, 5 pgs.

\* cited by examiner

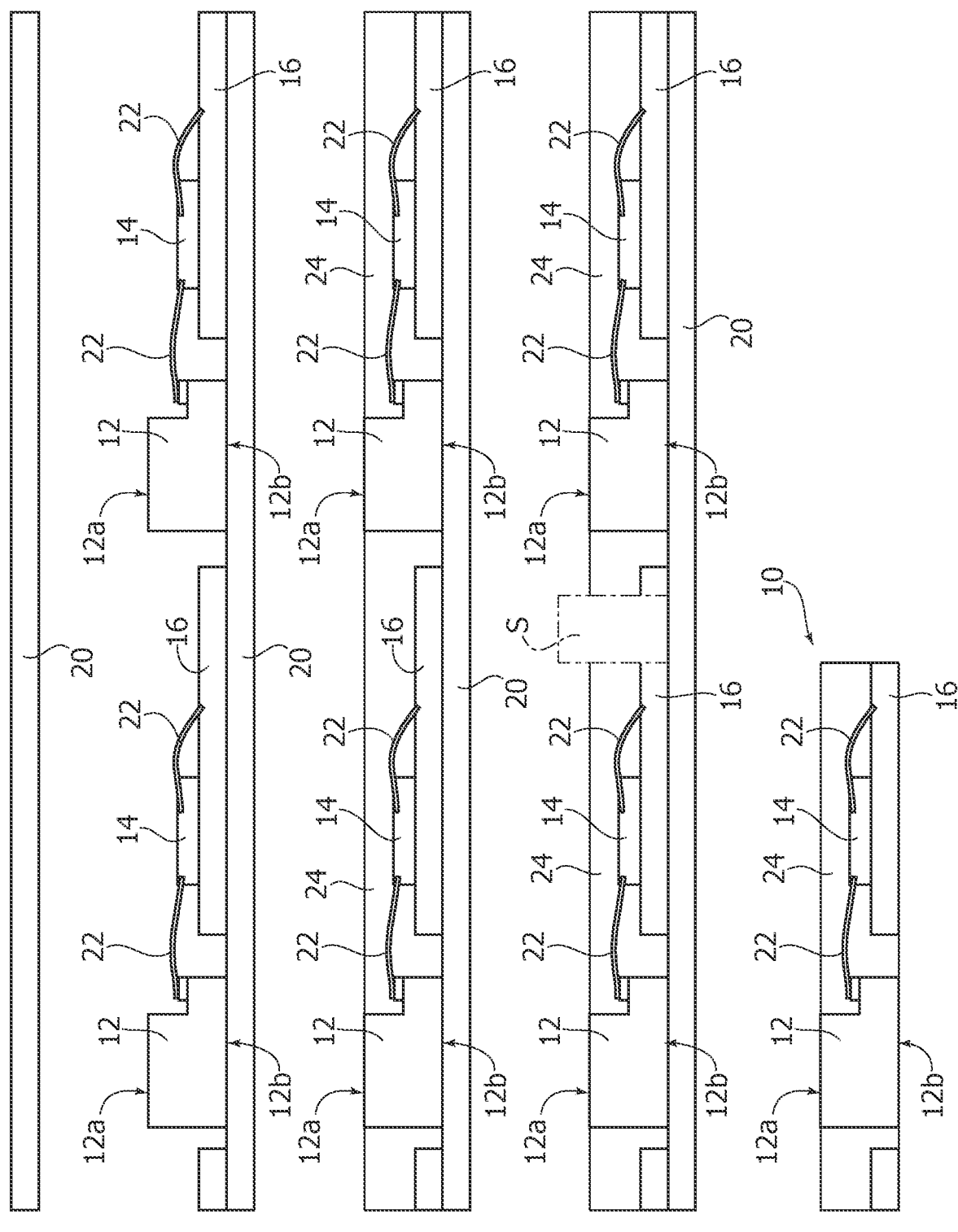

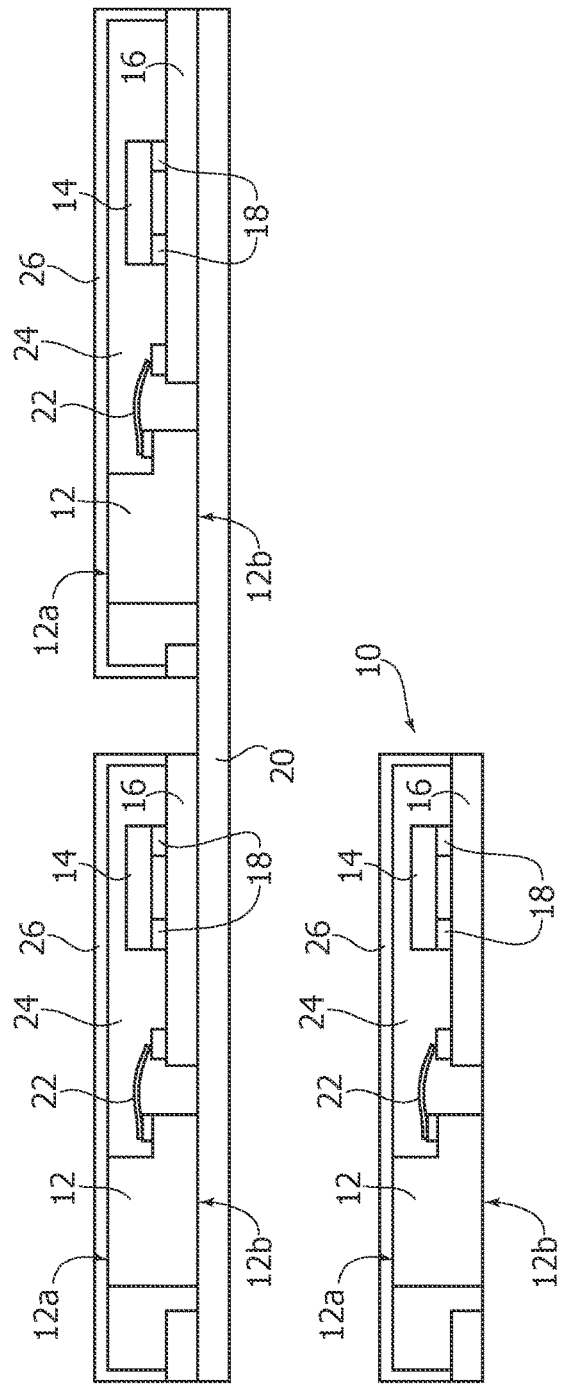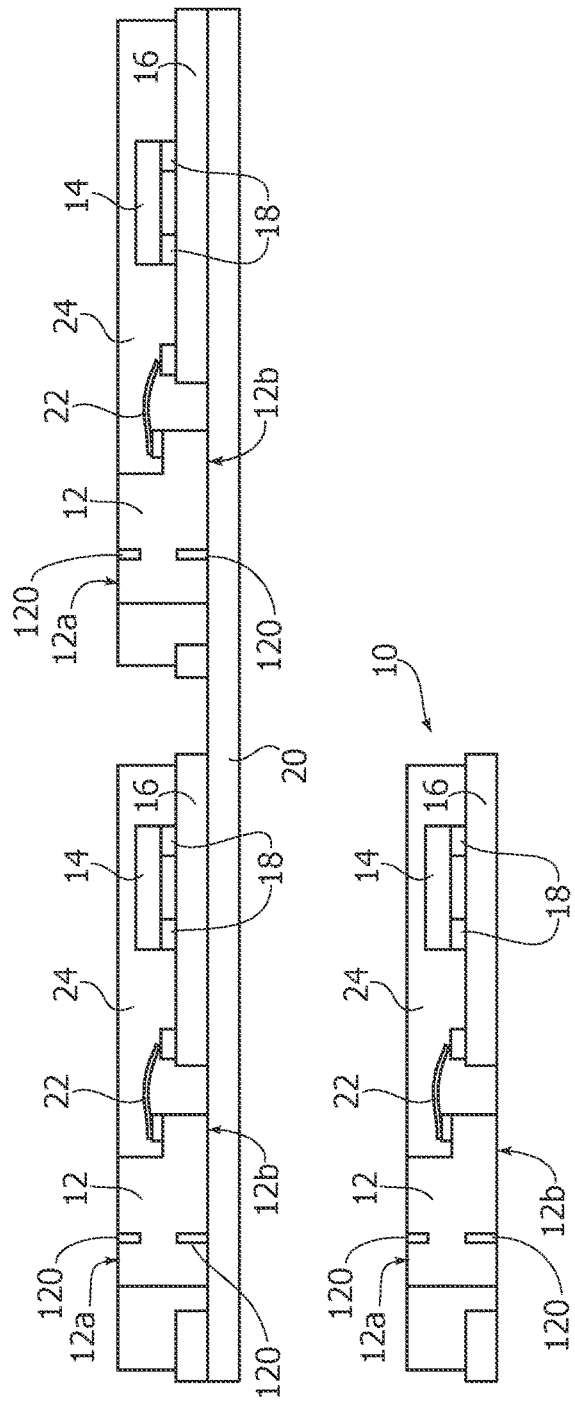

US 12,017,910 B2

METHOD OF MANUFACTURING ELECTRONIC DEVICES AND CORRESPONDING ELECTRONIC DEVICE

CROSS REFERENCE TO RELATED APPLICATION

This application is a divisional of U.S. patent application Ser. No. 16/834,042, filed Mar. 30, 2020, which claims the priority benefit of Italian Application for Patent No. 102019000004835, filed on Apr. 1, 2019, the contents of which are hereby incorporated by reference in their entireties to the maximum extent allowable by law.

TECHNICAL FIELD

The description relates to electronic devices.
One or more embodiments may be applied to sensors such as those of a Micro Electro-Mechanical Systems (MEMS) type.

BACKGROUND

Electronic devices including a Micro Electro-Mechanical Systems (MEMS) sensor and an associated "companion" chip such as an Application-Specific Integrated Circuit (ASIC) are now common in the art with the MEMS component mounted onto the companion integrated circuit (IC) chip or arranged on a same substrate as the companion IC chip.

Such devices may be packaged in a full-mold package having a thickness defined by the substrate and the mold chase.

Reducing the total device package thickness is a desirable goal which may be pursued by reducing the substrate thickness and/or reducing the chase thickness by improving process tolerances.

Another option in that direction may involve moving to a Chip Scale Package (CSP) process. It is noted that a CSP approach may not be applicable to MEMS and other sensor structures due to specific features of the associated Front End (FE) processes.

Exposing the "top" side of the semiconductor (silicon) substrate has also been proposed, primarily with the purpose of opening sensing ports in pressure sensors or optical devices, for instance. Exposing the "bottom" side of the substrate has also been proposed in order to improve thermal dissipation from the package.

It is noted that a limiting factor of such approaches is related to the use of a substrate, frame and/or mold compound surrounding (embedding, for instance) the device in its entirety.

There is a need in the art to provide a solution which overcomes the disadvantages outlined in the foregoing.

SUMMARY

One or more embodiments involve arranging side-by-side on a support surface (such as a tape, for instance) a sensor component (a MEMS component, for instance) and a companion chip (an ASIC, for instance) mounted on an associated substrate. After providing electric coupling between the sensor component and the companion chip, a packaging compound is overmolded on the assembly. The support tape is removed so that the resulting package exhibits a final thickness essentially corresponding to the (sole) thickness of the sensor component.

BRIEF DESCRIPTION OF THE DRAWINGS

One or more embodiments will now be described, by way of example only, with reference to the annexed figures, wherein:
FIGS. 2A to 2E show steps of a method for making an embodiment,
FIGS. 3A and 3B show a possible variant,
and
FIGS. 4A and 4B show another possible variant.

DETAILED DESCRIPTION

Figure 1A:
FIGS. 1A to 1E show steps of a method for making an embodiment.

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

The references used herein are provided merely for convenience and hence do not define the extent of protection or the scope of the embodiments.

One or more embodiments as exemplified herein facilitate providing a full-mold package for an electronic device suited to be produced by resorting to standard and generally available technologies while pursuing a reduction of the total thickness of the resulting device.

One or more embodiments may be applied, for instance, to an electronics device 10 comprising:
at least one first electronic component 12 such as a sensor (a MEMS sensor being exemplary of such an component), and
at least one second electronic component 14 such as associated "companion" semiconductor integrated circuit chip or die (an ASIC being exemplary of such a semiconductor IC chip or die) mounted on a respective substrate 16.

The designation "respective" highlights the fact that, in one or more embodiments as exemplified herein, the substrate 16 (which may be regarded as akin to a printed circuit board or PCB) is configured to support (only) the semiconductor chip 14 and not the sensor component 12, so that the thickness of the substrate 16 does not add to the thickness of the sensor 12.

As exemplified herein, the first component 12 will exhibit a front or "top" surface 12a and a rear or "bottom" surface 12b with a thickness of the component 12 identified by the distance between the surfaces 12a, 12b.

As discussed previously, there is a need to reduce the total thickness of the device 10 by letting such a thickness be essentially determined by the thickness of the component 12 (a sensor such as a MEMS, for instance), possibly with both surfaces or sides of the component 12 (namely the front surface 12*a* and the back surface 12*b*) exposed at the package surface.

In one or more embodiments as portrayed in a first exemplary sequence of processing steps in FIGS. 1A to 1E, a (sacrificial) carrier 20 is provided (FIG. 1A) onto which the component 12 (e.g. a sensor) and a companion component 14 (e.g. a semiconductor chip) are arranged side-by-side with the component 14 mounted on the substrate 16. This may be via bumps 18, as conventional in the art.

Figure 1B:
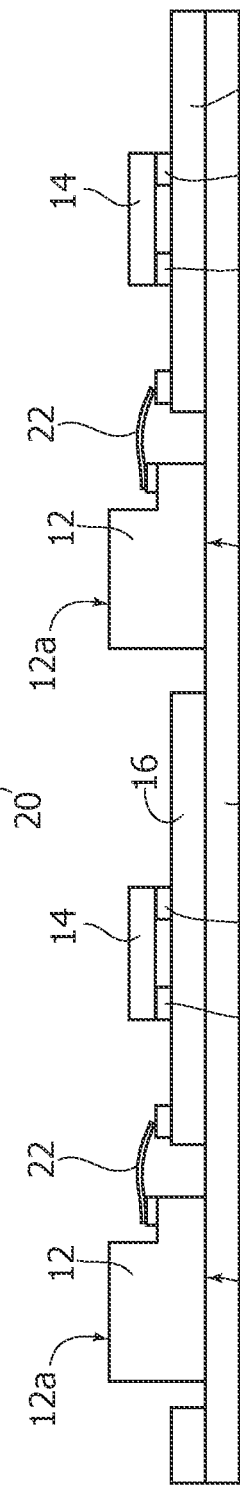
Figure 1C:
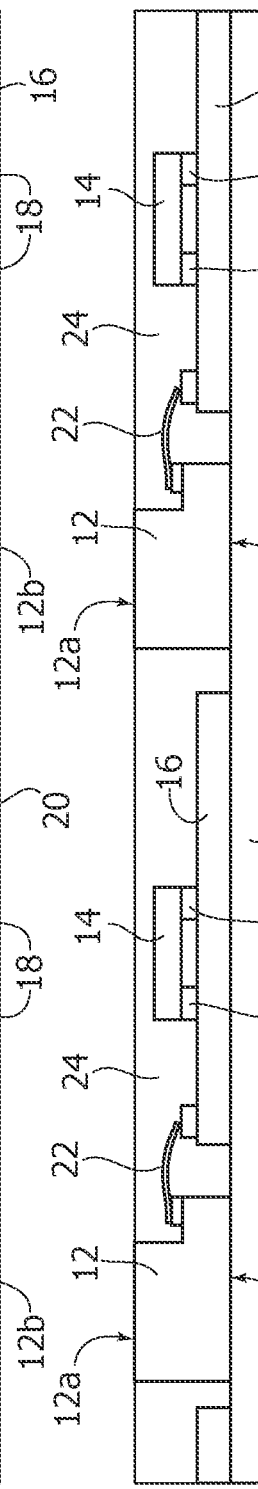
Figure 1D:
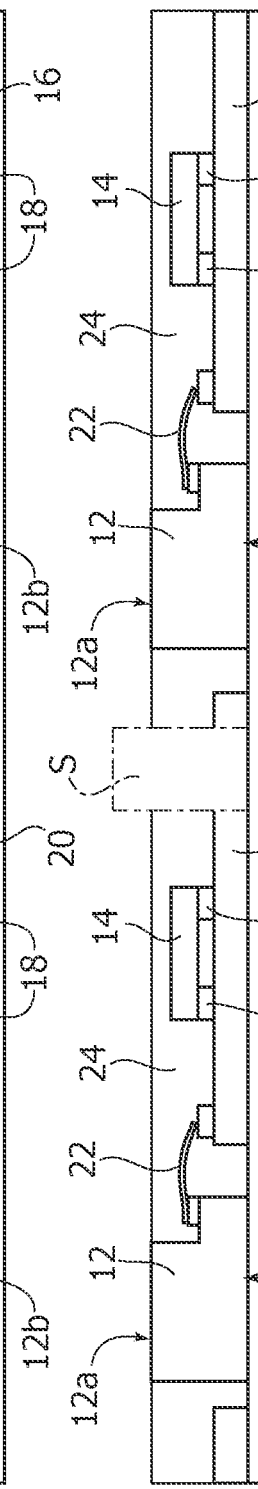
Figure 1E:
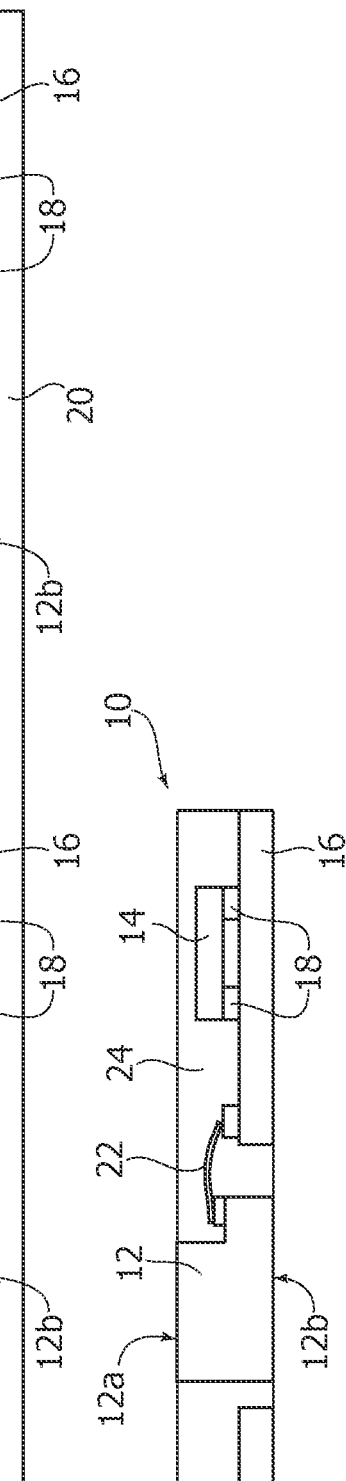

FIGS. 1B to 1D are exemplary of processing steps in a manufacturing process which can be performed on a plurality of similar structures or assemblies arranged on a tape-like carrier 20, with these structures eventually separated in a "singulation" step as exemplified in FIG. 1D to provide individual devices 10 (FIG. 1E).

In one or more embodiments, the carrier 20 may include a tape (a polycarbonate tape, for instance) as conventional in manufacturing processes of integrated circuits (ICs).

Once the components 12 and 14 (wherein the component 14 is mounted on the substrate 16) are arranged side-by-side on the carrier 20, with electrical coupling 22 provided therebetween as desired (again by conventional solutions, such as wire bonding, for instance) a package molding compound 24 can be molded onto the previously formed assembly as exemplified in FIG. 1C, that is by leaving exposed the "cap", namely the front surface 12*a* of the component 12.

An Epoxy Molding Compound (EMC) may be exemplary of the package molding compound 24.

FIG. 1D is exemplary of a singulation processing step (performed, in conventional manner, via a singulation tool indicated S) followed by removal of the carrier 20 (FIG. 1E) leading to both the front side or surface 12*a* and the rear or back side 12*b* of the component 12 being exposed at the surface of the molding material 24.

As a result the package thickness of the device 10 is determined by (that is, essentially the same as) the thickness of the component 12 alone (that is the thickness between the surfaces 12*a*, 12*b*).

Also, while the opposed surfaces 12*a*, 12*b* of the component 12 are exposed at the package surface, the material of the component 14 (a semiconductor such as silicon, for instance) is embedded and thus "floating" within the package molding compound 24.

Those of skill in the art will easily appreciate that the sequence of processing steps of FIGS. 1A to 1E is merely exemplary and non-mandatory: for instance, singulation, here exemplified before removal of the carrier 20, may take place after or simultaneously with removal of the carrier 20.

In FIGS. 2A to 2E parts, components or processing steps like parts, components or processing steps already discussed in connection with FIGS. 1A to 1E are indicated with like reference symbols. A corresponding detailed description will not be repeated for brevity.

In embodiments as exemplified in FIGS. 2A to 2E electrical coupling of the component (semiconductor chip) 14 to the substrate 16 is achieved via wire-bonding (again indicated 22) in the place of bumps such as bumps 18 in FIGS. 1B to 1E.

Here again, the package thickness of the device 10 is essentially determined by the thickness of the component 12 alone (that is the thickness between the surfaces 12*a*, 12*b*), with the possible "height" of the wire bond loops 22 having no practical impact on the total thickness of the device 10 even taking into account the thickness of the component 14 and the substrate (which may be reasonably expected to be thinner than the component 12).

Here again, while the opposed surfaces 12*a*, 12*b* of the component 12 are exposed at the package surface, the material of the component 14 (a semiconductor such as silicon, for instance) is embedded and thus "floating" within the package molding compound 24.

FIGS. 3A and 3B can be regarded as essentially corresponding to FIGS. 1D and 1E with parts, components or processing steps already discussed in connection with FIGS. 1A to 1E indicated with like reference symbols. A corresponding detailed description will not be repeated for brevity.

FIGS. 3A and 3B are exemplary of the possibility (which may apply both to embodiments as exemplified in FIGS. 1A to 1E and to embodiments as exemplified in FIGS. 2A to 2E) of providing electromagnetic shielding material 26 onto the top or front surface of the component 10 (including the front or top surface 12*a* of the component 12).

Such an approach may be advantageous in case the component 12 (a sensor component, for instance) is sensitive to electromagnetic signal.

The shielding material 26 may comprise (in a manner known to those of skill in the art) electrically-conductive material such as a metal which can be applied onto the component 10 after device singulation and possible dedicated substrate design.

FIGS. 4A and 4B can be regarded again as essentially corresponding to FIGS. 1D and 1E with parts, components or processing steps already discussed in connection with FIGS. 1A to 1E indicated with like reference symbols. A corresponding detailed description will not be repeated for brevity.

FIGS. 4A and 4B are exemplary of the possibility (which may apply both to embodiments as exemplified in FIGS. 1A to 1E and to embodiments as exemplified in FIGS. 2A to 2E) of providing a (very) thin sensor—a differential pressure sensor, for instance—with pressure ports 120 provided at the exposed surfaces (for instance both the front surface 12*a* and the back surface 12*b*) of the sensor component 12.

Also those of skill in the art will appreciated that the stepped outline of the sides of the device in FIGS. 4A and 4B is indicative of the possibility, in one or more embodiments, of providing shielding 26 as exemplified in FIGS. 3A and 3B also in arrangements as exemplified in FIGS. 4A and 4B.

One or more embodiments thus make it possible to reduce the thickness of the device 10 by letting it be essentially given by the thickness of the first component 12 (a MEMS, for instance) without any contribution to the device thickness given by the substrate 16 for the companion component 14 and/or by the mold chase thickness.

In one or more embodiments as exemplified herein the (total) thickness of the molded package (see FIGS. 1E, 2E, 3B and 4B, for instance) is determined by the thickness of a single component (here, the component 12) which, contrary to the component 14, has no associated substrate by avoiding a combination with the substrate and/or mold material thickness.

Also, one or more embodiments lend themselves (in the case of a small routing specifications and/or low signal count, for instance) to implementations where the substrate (16 in the figures) is provided via a copper frame.

Also, certain embodiments (this may be the case of non-capped devices) may facilitate using a component 14 provided with a "dummy" die/interposer mounted on top. This may be advantageous in cases where the exposed front and/or back sides of the component may facilitate (via such a dummy die for instance) a thermal dissipation function and/or a thermal sensing function.

In one or more embodiments, electromagnetic interference (EMI) shielding can be enhanced by resorting to a shielding (metalized, for instance) backside and/or to conductive dummy dies at one or both of the opposed surfaces.

A method as exemplified herein may comprise:
providing a (planar, for instance) support member (for instance, 20),
arranging on the support member:
a) at least one first electronic component (for instance, 12) having opposed first (for instance, 12a) and second (for instance, 12b) surfaces, the at least one first electronic component arranged on the support member with the second surface towards the support member, wherein the at least one first electronic component has a thickness between the opposed first and second surfaces (for instance, between 12a and 12b),
b) at least one second electronic component (for instance, 14) mounted on a substrate (for instance, 16), the at least one second electronic component arranged on the support member with the substrate having a substrate surface (facing downwards, in the figures) opposed the at least one second electronic component and facing towards the support member, wherein the substrate and the at least one second electronic component mounted thereon have a joint (that is, cumulative) thickness which is less than the thickness of the at least one first electronic component (see, for instance FIGS. 1B thru 1E, FIGS. 2B thru 2E, 3A and 3B, 4A and 4B),
molding package molding material (for instance, 24) onto the support member having arranged thereon the at least one first electronic component and the at least one second electronic component mounted on the substrate, wherein the package molding material encapsulates the at least one second electronic component leaving exposed (at the surface of the molding material) the first surface of the at least one first electronic component (see, for instance, FIGS. 1C, 2C, 3A and 4A), and
separating (removing, for instance) the support member to expose the second surface of the at least one first electronic component and the substrate surface of the substrate opposed the at least one second electronic component (see, for instance, FIGS. 1E, 2E, 3B and 4B).

A method as exemplified herein may comprise:
a) providing electrically-conductive formations (for instance, 18 or 22) between:
the at least one second electronic component and the substrate (see, for instance, the bumps 18 in FIGS. 1B to 1E or the wires 22 on the right side of the component 14 in FIGS. 2B to 2E), and/or
the at least one first electronic component and the substrate (see, for instance, the wires 22 on the right side of the component 12 in FIGS. 1B to 1E and 2B to 2E), and/or
the at least one first electronic component and the at least one second electronic component (see, for instance, the wires 22 between the components 12 and 14 in FIGS. 2B to 2E),
b) molding the package molding material onto the support member having arranged thereon the at least one first electronic component and the at least one second electronic component mounted on the substrate, wherein the package molding material encapsulates said electrically-conductive formations.

A method as exemplified herein may comprise providing electromagnetic shielding material (for instance, 26) over at least one (for instance, 12a) of the first and second opposed surfaces of the at least one first electronic component. As discussed a "dummy" shield may be provided on either of both of these surfaces.

In a method as exemplified herein the at least one first electronic component may comprise a pressure sensor with at least one of the opposed first and second surfaces provided with pressure ports (for instance, 120).

In a method as exemplified herein, the support member may comprises a tape.

In a method as exemplified herein:
the at least one first electronic component may comprise a sensor, optionally a MEMS, and/or
the at least one second electronic component may comprise a semiconductor integrated circuit chip, optionally an ASIC.

A method as exemplified herein may comprise:
arranging on the support member a sequence of assemblies, wherein each assembly may comprise:
a) at least one first electronic component having opposed first and second surfaces, the at least one first electronic component arranged on the support member with the second surface towards the support member, wherein the at least one first electronic component has a thickness between the opposed first and second surfaces,
b) at least one second electronic component mounted on a substrate, the at least one second electronic component arranged on the support member with the substrate having a substrate surface opposed the at least one second electronic component and facing towards the support member, wherein the substrate and the at least one second electronic component mounted thereon have a joint thickness with is less than the thickness of the at least one first electronic component,
molding onto the support member having arranged thereon said sequence of assemblies, package molding material to encapsulate the at least one second electronic component in the assemblies in said sequence of assemblies leaving exposed the first surface of the at least one electronic component in the assemblies in said sequence of assemblies,
separating the support member to expose the second surface of the at least one first electronic component and the substrate surface of the substrate opposed the at least one second electronic component in the assemblies in said sequence of assemblies, and
singulating (for instance, S) said sequence of assemblies into individual devices including at least one said first electronic component and least one said second electronic component coupled therewith.

A device (for instance, 10) as exemplified herein, may comprise:
at least one first electronic component having opposed first and second surfaces, the at least one first electronic component arranged on the support member with the second surface towards the support member, wherein the at least one first electronic component has a thickness between the opposed first and second surfaces,
at least one second electronic component mounted on a substrate, the at least one second electronic component arranged on the support member with the substrate having a substrate surface opposed the at least one second electronic component and facing towards the support member, wherein the substrate and the at least one second electronic component mounted thereon have a joint thickness with is less than the thickness of the at least one first electronic component, and package molding material encapsulating the at least one second electronic component leaving exposed the opposed first and second surfaces of the at least one electronic component and the substrate surface of the substrate opposed the at least one second electronic component.

A device as exemplified herein may comprise electrically-conductive formations between:

the at least one second electronic component and the substrate, and/or the at least one first electronic component and the substrate, and/or the at least one first electronic component and the at least one second electronic component, wherein said package molding material may encapsulate said electrically-conductive formations.

A device as exemplified herein may comprise electromagnetic shielding material over at least one of the first and second opposed surfaces of the at least one first electronic component.

In a device as exemplified herein the at least one first electronic component may comprise a pressure sensor, with at least one of the opposed first and second surfaces provided with pressure ports.

In a device as exemplified herein:

the at least one first electronic component (12) may comprise a sensor, optionally a MEMS, and/or the at least one second electronic component (14) may comprise a semiconductor chip, optionally an ASIC.

Without prejudice to the underlying principles, the details and embodiments may vary, even significantly, with respect to what has been described by way of example only, without departing from the scope of protection.

The claims are an integral part of the technical disclosure of embodiments as provided herein.

The extent of protection is determined by the annexed claims.

The invention claimed is:

1. A device, comprising:
a first electronic component having opposed first and second surfaces, wherein the first electronic component has a first thickness between the opposed first and second surfaces;
a substrate;
a second electronic component mounted on a first surface of the substrate, wherein the substrate and the second electronic component mounted thereon combined have a second thickness that is less than the first thickness; and
a package molding material that encapsulates the first and second electronic components and the substrate but leaves exposed the opposed first and second surfaces of the first electronic component and a second surface of the substrate opposite the first surface of the substrate, wherein the package molding material has a third thickness between the first and second surfaces of the package molding material that is equal to the first thickness; and
wherein the first surface of the package molding material is coplanar with the first surface of the first electronic component but covers the first surface of the second electronic component; and wherein the second surface of the package molding material is coplanar with the second surface of the first electronic component and coplanar with the second surface of the substrate.

2. The device of claim 1, further comprising electrically-conductive formations between the second electronic component and the substrate, wherein the package molding material encapsulates said electrically-conductive formations.

3. The device of claim 1, further comprising electrically-conductive formations between the first electronic component and the substrate, wherein the package molding material encapsulates said electrically-conductive formations.

4. The device of claim 1, further comprising electrically-conductive formations between the first electronic component and the second electronic component, wherein the package molding material encapsulates said electrically-conductive formations.

5. The device of claim 1, further comprising an electromagnetic shield over at least one of the opposed first and second surfaces of the first electronic component and over at least one of the first and second surfaces of the package molding material.

6. The device of claim 1, wherein the first electronic component comprises a pressure sensor, and wherein a pressure port is provided at one or more of the opposed first and second surfaces.

7. The device of claim 1, wherein the first electronic component comprises a sensor and the second electronic component comprises a semiconductor integrated circuit chip.

8. The device of claim 1, where the sensor is a Micro Electro-Mechanical Systems (MEMS) sensor and wherein the semiconductor integrated circuit chip is an Application Specific Integrated Circuit (ASIC).

9. A device, comprising:
a first electronic component having opposed first and second surfaces, wherein the first electronic component has a first thickness between the opposed first and second surfaces;
a substrate;
a second electronic component mounted on the substrate, wherein the substrate and the second electronic component mounted thereon together have a second thickness which is less than the first thickness;
package molding material encapsulating the first and second electronic components and having opposed third and fourth surfaces, said package molding material leaving exposed the opposed first and second surfaces of the first electronic component and the substrate surface of the substrate opposed the second electronic component, wherein the package molding material has a third thickness between the opposed third and fourth surfaces that is equal to the first thickness;
electrically-conductive formations between:
the second electronic component and the substrate; and
the first electronic component and the substrate; and
the first electronic component and the second electronic component;
wherein said package molding material encapsulates said electrically-conductive formations.

10. The device of claim 9, further comprising electromagnetic shielding material over at least one of the opposed first and second surfaces of the first electronic component.

11. The device of claim 9, wherein the first electronic component comprises a pressure sensor, and wherein at least one of the opposed first and second surfaces includes a pressure port.

12. The device of claim 9, wherein:
the first electronic component comprises a sensor; and
the second electronic component comprises a semiconductor chip.

13. The device of claim 12, wherein the sensor comprises a Micro Electro-Mechanical Systems (MEMS) device.

14. The device of claim 12, semiconductor chip comprises an Application Specific Integrated Circuit (ASIC).

15. An integrated circuit package having an exposed top surface and an exposed bottom surface, comprising:
a first electronic component having opposed first and second surfaces and a first thickness between the first surface of the first electronic component and the second surface of the first electronic component;
wherein the first surface of the first electronic component is exposed at the exposed top surface of the integrated circuit package;
wherein the second surface of the first electronic component is exposed at the exposed bottom surface of the integrated circuit package;
a substrate having opposed first and second surfaces;
a second electronic component mounted on the first surface of the substrate;
wherein the second surface of the substrate is exposed at the exposed bottom surface of the integrated circuit package; and
a package molding material that encapsulates the first and second electronic components and the substrate and has a second thickness between the exposed top surface of the integrated circuit package and the exposed bottom surface of the integrated circuit package, said second thickness being equal to the first thickness.

16. The device of claim 15, further comprising electrically-conductive formations between the second electronic component and the substrate, wherein the package molding material encapsulates said electrically-conductive formations.

17. The device of claim 15, further comprising electrically-conductive formations between the first electronic component and the substrate, wherein the package molding material encapsulates said electrically-conductive formations.

18. The device of claim 15, further comprising electrically-conductive formations between the first electronic component and the second electronic component, wherein the package molding material encapsulates said electrically-conductive formations.

19. The device of claim 15, wherein:
the first electronic component comprises a Micro Electro-Mechanical Systems (MEMS) sensor; and
the second electronic component comprises an Application Specific Integrated Circuit (ASIC) semiconductor chip.

* * * * *

UNITED STATES PATENT AND TRADEMARK OFFICE
CERTIFICATE OF CORRECTION

PATENT NO. : 12,017,910 B2  
APPLICATION NO. : 18/079704  
DATED : June 25, 2024  
INVENTOR(S) : Kevin Formosa et al.

Page 1 of 1

It is certified that error appears in the above-identified patent and that said Letters Patent is hereby corrected as shown below:

On the Title Page

(30) Foreign Application Priority Data should read:  
Apr. 1, 2019 (IT) ............................................ 102019000004835

Signed and Sealed this  
Thirtieth Day of September, 2025

John A. Squires  
*Director of the United States Patent and Trademark Office*